United States Patent [19]

Gay

[11] Patent Number: 4,876,464

[45] Date of Patent: Oct. 24, 1989

[54] SAMPLED DATA CIRCUIT

[75] Inventor: Michael J. Gay, Coppet, Switzerland

[73] Assignee: Motorola Inc., Schaumburg, Del.

[21] Appl. No.: 169,922

[22] Filed: Mar. 18, 1988

[30] Foreign Application Priority Data

Mar. 19, 1987 [GB] United Kingdom ................ 8706592

[51] Int. Cl.⁴ ............................................. G11C 27/02
[52] U.S. Cl. .................................... 307/353; 307/269;
307/520; 377/61; 377/78
[58] Field of Search ................ 307/352, 353, 269, 520;
365/149, 174, 177; 377/61, 62, 78, 79

[56] References Cited

U.S. PATENT DOCUMENTS 3,991,322 11/1976 Bush et al. ........................... 307/352

Primary Examiner—John Zazworsky

[57] ABSTRACT

A sampled data circuit having: two or more serially connected sampled data stages (2) each comprising switching means (6) and storage means (10); and clock means (4) for applying to the switching means of consecutive stages clock signals of respectively first and second phases alternating between first and second levels, characterized in that the clock signals also have a third level intermediate the first and second levels which is occupied simultaneously by the first and second phase clock signals.

6 Claims, 1 Drawing Sheet

SAMPLED DATA CIRCUIT

INTRODUCTION

This invention relates to sampled data circuits. Sampled data circuits are widely used in, inter alia, analogue filters. Many modern electronic systems use sampled data analogue filters since these are precise and suitable for fabrication in integrated circuit (IC) form. One disadvantage they exhibit is radiation at a multiple of the clock frequency. This tends to be produced because the switches used to control the data transfer must all be simultaneously open during the transitions of the clock. The currents controlling the switches must thus all be low, or high, twice per clock period. The supply current of the system may consequently carry an important component in the form of pulses at twice the clock frequency.

It is the object of this invention to sensibly reduce this undesirable component.

STATEMENT OF THE INVENTION

In accordance with the invention a sampled data circuit having: two or more serially connected sampled data stages each comprising switching means and storage means; and clock means for applying to the switching means of consecutive stages clock signals of respectively first and second phases alternating between first and second levels, wherein the clock signals also have a third level intermediate the first and second levels which is occupied simultaneously by the first and second phase clock signals.

BRIEF DESCRIPTION OF THE DRAWINGS

One sampled data circuit in accordance with the invention will now be described, by way of example only, with reference to the accompanying drawings, in which.

DESCRIPTION OF SPECIFIC EMBODIMENT OF THE INVENTION

Figure 1:
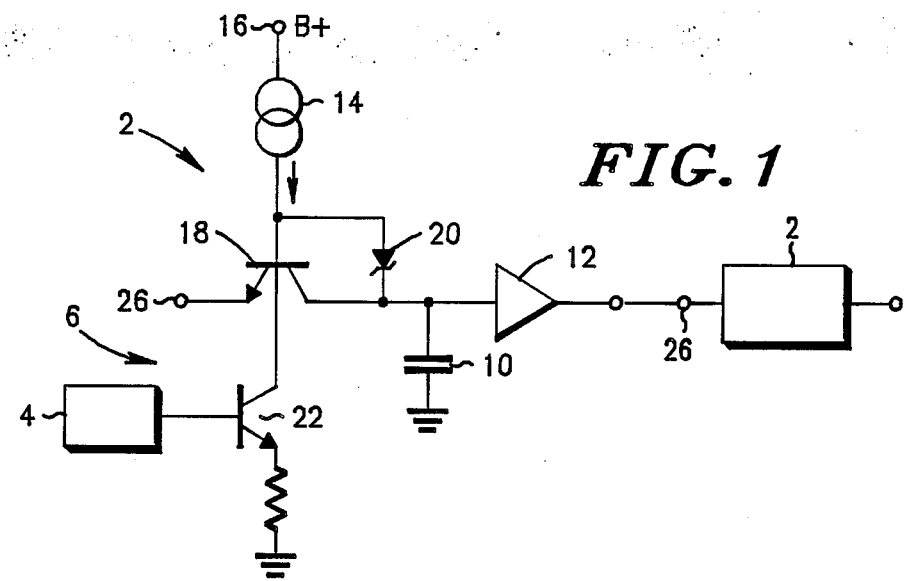
FIG. 1 shows part of the sampled data circuit.

Referring now to FIG. 1 a sampled data circuit has a number of sampled data stages 2 (only two of which are shown) under the control of a clock generator 4. Each sampled data stage comprises a bipolar switch 6, storage capacitor 10 and buffer amplifier 12. Such an assemblage may constitute the basic building block of a sampled signal processing circuit. The assemblage also contains a current source 14 connected between a positive supply line 16 and the base of an npn transistor 18, said base being also connected to the anode of a Schottky diode 20 and the collector of a driver transistor 22. The cathode of the Schottky diode 20 is connected to the collector of the transistor 18, the transistor-diode combination forming the switch 6, the state of which is controlled by the magnitude of the collector current of the driver transistor 22, which is in turn controlled by a clock signal applied to the base of the driver transistor 22 from the clock generator 4. As will be further explained below clock signals of alternate phases are applied to alternate sampled data stages 2 so that sampled data is transferred sequentially from stage to stage in known manner.

When the clock signal applied to a sampled data stage is low, transistor 22 is rendered non-conducting and the current supplied by current source 14 flows via the Schottky diode 20 and transistor 18 to input node 26 of the stage, which must be designed to absorb said current. In this condition the combination of transistor 18 and Schottky diode 20 presents a low impedance allowing the storage capacitor 10 to be charged to a voltage representative of the signal voltage applied at node 26.

When the clock signal is high transistor 22 is caused to absorb a current higher than that supplied by the current source 14, the excess current in this embodiment being drawn from the circuit 4 providing the clock signal. Transistor 18 is rendered non-conducting and the voltage stored on capacitor 10 remains at a level representative of the signal voltage applied at node 26 at the end of the clock period. This sample of the signal is supplied to the following sampled data stage via the buffer amplifier 12, the output of which is connected to the input node of the following stage.

As mentioned above, a number of such circuits connected in series are used in a signal processing arrangement, e.g. a filter, the even stages being controlled by a clock signal of a first phase and the odd stages by a clock signal of a second phase. It will be clear that the even stage switches may only be conducting while the odd stage switches are non-conducting, and vice versa, since otherwise a signal would be propagated immediately through all the stages instead of being propagated under the control of the clock. There must therefore be periods around each clock transition time when both switches are open, that is all driver transistors 22 are conducting and absorbing currents in excess of those supplied by the current sources 14.

Outside these periods only alternate transistors 22 are conducting. The total supply current will thus be substantially higher during the periods around the clock transition times than otherwise.

Figure 2:
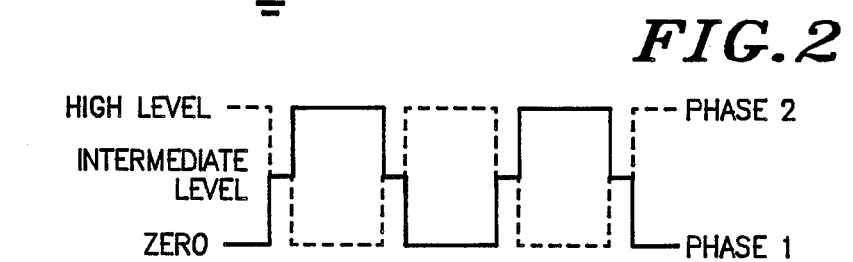
FIG. 2 shows clock waveforms generated in the circuit of FIG. 1.

To eliminate this effect the invention employs three-level clock signals as shown in FIG. 2. The intermediate level, occupied simultaneously by both phases of the clock, suffices to open the switches. The high level is such that the total current flow occasioned is the same as that occasioned when the phases are at the intermediate level. The pulses of high current which would flow at the clock transition times with conventional two-level clock signals are thus eliminated.

Figure 3:
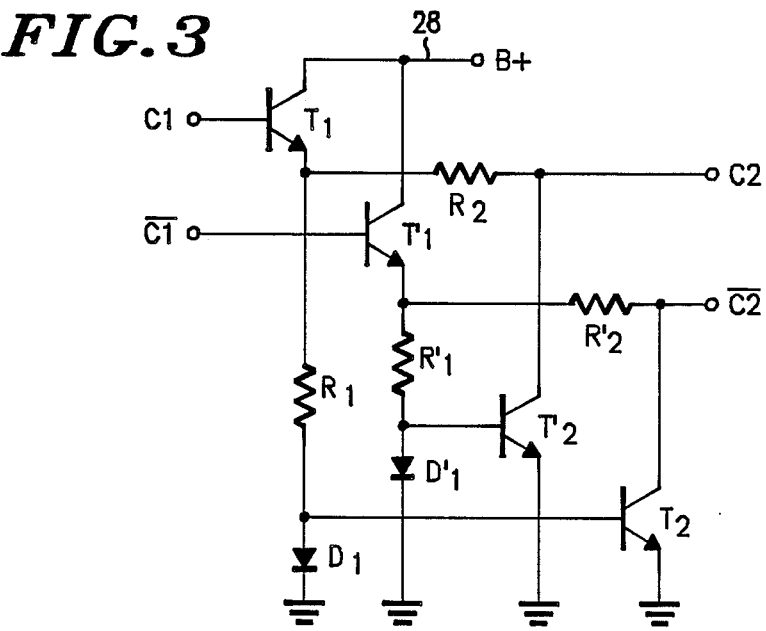
FIG. 3 shows in greater detail the circuit of the clock generator of FIG. 1.

Referring now to FIG. 3, the clock generator circuit 4 for generating clock waveforms of the form shown in FIG. 2 has inputs C1, $\overline{C1}$, to which are applied simple overlapping clock inputs.

The inputs C1, $\overline{C1}$ of the clock generator 4 are connected respectively to the bases of npn bipolar transistors T1, T'1. These transistors each have their collectors connected to a supply line 28 and their emitters connected via respective resistors and diodes R1, D1 and R'1, D'1 to ground. The emitters of the transistors T1, T'1 are also connected respectively via resistors R2, R'2 to outputs of the circuit C2, $\overline{C2}$. The cathodes of the diodes D1, D'1 are connected respectively to the bases of transistors T2, T'2. The collectors of the transistors T2, T'2, are connected respectively to the outputs C2, $\overline{C2}$ and the emitters of the transistors are connected to ground.

Operation of the clock generator circuit of FIG. 3 will be readily appreciated. If, for example, C1 is high and $\overline{C1}$ low, then C2 is high and $\overline{C2}$ low. While both C1 and $\overline{C1}$ are high, C2 and $\overline{C2}$ are reduced to the intermediate level by the cross coupling via R1, D1, T2, R'2 and R'1, D'1, T'2, R2. It will be understood that this cross-coupling also serves to generate a pull down current for the low level output.

Although the arrangement described above requires almost twice the current that would be needed to operate the switches when using simple two-level clock signals, it will be appreciated that in a more practical circuit the excess of current drawn by transistor 22 over that supplied by current source 14 can be routed to serve as a bias current for the buffer amplifier 12. In this way the current overhead can be reduced to approximately 40%.

It will also be appreciated that although the sampled data circuit above has been described as operating with a two-phase clock, the invention is not limited to use with a two-phase clock but is also applicable to sampled data systems utilising clocks having three or more phases.

I claim:

1. A sampled data circuit having two or more serially connected sampled data stages each comprising switching means and storage means; and clock means for applying to the switching means of consecutive stages clock signals for sequentially moving sampled data between consecutive stages, said clock signals having respectively first and second signal levels at which high and low currents respectively are drawn by individual stages, wherein the clock signals also have a third level intermediate the first and second levels which is occupied simultaneously by the first and second clock signals, at which the switching means act in the same manner as at the first level and at which a current substantially less than the high current is drawn by individual stages.

2. A sampled data circuit according to claim 1 wherein the clock means includes a clock generator comprising:
    a first transistor having a control electrode for receiving a first clock input signal, a first current electrode for connection to a first potential and a second current electrode coupled to a first output node;
    a first diode coupled between the second current electrode of the first transistor and a node for receiving a second potential;
    a second transistor having a control electrode for receiving a second clock input signal of opposite polarity to the first clock input signal, a first current electrode for connection to a source of supply potential and a second current electrode coupled to a second output node;
    a second diode coupled between the second current electrode of the second transistor and the node;
    a third transistor having a control electrode connected to the first diode at its electrode remote from the datum node, a first current electrode connected to the second output node and an second current electrode connected to the datum node; and
    a fourth transistor having a control electrode connected to the second diode at its electrode remote from the datum node, a first current electrode connected to the first output node and a second current electrode connected to the datum node.

3. A sampled data circuit according to claim 2 wherein the transistors are bipolar transistors, the first current electrodes are collectors and the second current electrodes are emitters.

4. A sampled data circuit according to claim 1 wherein the total current drawn by the stages when the first and second clock signals simultaneously have the intermediate level is substantially the same as the total current drawn when one of the clock signals has the first level and the other of the clock signals has the second level.

5. An integrated sampled data circuit having two or more serially connected sampled data stages each comprising switching means and storage means; and clock means for applying to the switching means of consecutive stages clock signals for sequentially moving sampled data between consecutive stages, said clock signals having respectively first and second signal levels at which high and low currents respectively are drawn by individual stages, wherein the clock signals also have a third level intermediate the first and second levels which is occupied simultaneously by the first and second clock signals, at which the switching means act in the same manner as at the first level and at which a current substantially less than the high current is drawn by individual stages.

6. The circuit of claim 5 wherein the clock means includes:
    a first transistor having a control electrode to which a first clock input signal is supplied, a first electrode coupled to a first power supply conductor, and a second electrode coupled to a first output;
    a first diode coupled between said second electrode of said first transistor and a second power supply conductor,
    a second transistor having a control electrode to which a second clock input signal is supplied, a first electrode coupled to said first power supply conductor and a second electrode coupled to a second output;
    a second diode coupled between said second electrode of said second transistor and said second power supply conductor,
    a third transistor having a control electrode coupled between said first electrode of said first transistor and said first diode, a first coupled to said second power supply conductor and a second electrode coupled to said second output and
    a fourth transistor having a control electrode coupled between said first electrode of said second transistor and said second diode, a first electrode coupled to said second power supply conductor and a second electrode coupled to said first output.

* * * * *